United States Patent [19]

Choi et al.

[11] Patent Number: 5,793,074
[45] Date of Patent: Aug. 11, 1998

[54] METAL OXIDE SEMICONDUCTOR CAPACITORS HAVING UNIFORM C-V CHARACTERISTICS OVER AN OPERATING RANGE AND REDUCED SUSCEPTIBILITY TO INSULATOR BREAKDOWN

[75] Inventors: Hoon Choi; Seung-Cheol Oh, both of Kyungki-do, Rep. of Korea

[73] Assignee: Samsung Electronics Co., Ltd., Kyungki-do, Rep. of Korea

[21] Appl. No.: 684,464

[22] Filed: Jul. 19, 1996

[30] Foreign Application Priority Data

Jul. 21, 1995 [KR] Rep. of Korea ............ 21631/1995

[51] Int. Cl.$^6$ ............................................. H01L 27/108
[52] U.S. Cl. ............................................. 257/296; 257/532
[58] Field of Search ............................ 257/288, 296, 257/300, 306, 312, 313, 532, 595

[56] References Cited

U.S. PATENT DOCUMENTS 5,608,258 3/1997 Rajkanan et al. ............... 257/532

*Primary Examiner*—Minh-Loan Tran
*Attorney, Agent, or Firm*—Myers Bigel Sibley & Sajovec, L.L.P.

[57] ABSTRACT

A MOS capacitor has uniform C-V capacitance characteristics across an operating voltage range and has reduced susceptibility to insulator breakdown and includes a semiconductor substrate of first conductivity type, a region of insulating material on an upper surface of the substrate and a well region of second conductivity type extending adjacent the region of insulating material. The well region is spaced from the region of insulating material so that the substrate extends to the upper surface therebetween. A source region of second conductivity type is formed in the well region. An insulating layer is formed on the source region and extends over the region of insulating material. A first electrode is formed on the insulating layer and a second electrode is formed on the source region. The capacitor also includes a P-N junction established between the source region of second conductivity type and the region of insulating material beneath the insulating layer. This P-N junction provides the capacitor with substantially uniform capacitance characteristics when a voltage is applied between the first electrode and the second electrode. Furthermore, because some of the voltage differential is established across the P-N junction during operation, the electric field at the corner of the region of insulating material and the insulating layer is reduced.

8 Claims, 5 Drawing Sheets

5,793,074

METAL OXIDE SEMICONDUCTOR CAPACITORS HAVING UNIFORM C-V CHARACTERISTICS OVER AN OPERATING RANGE AND REDUCED SUSCEPTIBILITY TO INSULATOR BREAKDOWN

RELATED APPLICATIONS

The present application is based and claims priority from Korean Application No. 21631/1995 filed Jul. 21, 1995, the disclosure of which is incorporated herein by reference as if set forth fully.

FIELD OF THE INVENTION

The present invention relates to semiconductor devices, and more particularly to metal oxide semiconductor (hereinafter, referred to as "MOS") devices.

BACKGROUND OF THE INVENTION

Prior art MOS capacitors have generally had one of two structures. These structures are illustrated in FIGS. 1 and 3. In particular, FIG. 1 illustrates a symbolic view, a planar view and a sectional view of a MOS capacitor having a semiconductor substrate 2, which may be of either P-type or N-type semiconductor material, connected to a ground voltage terminal 1. The capacitor of FIG. 1 includes diffusion regions 9 which may be formed by diffusing impurities into the substrate to create a region of opposite conductivity type relative to the semiconductor substrate 2, therein. An insulating region 5, which may be formed by oxidation, is provided at a face of the substrate 2, between the diffusion regions 9. A second insulator 11 is also provided. The second insulator 11 may comprise a silicon dioxide film which is deposited onto a portion of an upper surface of the diffusion regions 9, onto the upper surface of the substrate 2 and onto an upper surface of the insulating region 5. A gate electrode 7 is formed by depositing a polysilicon layer onto the upper surface of the second insulator 11. Gate and source contacts 3 and 10 are also provided for making electrical contact to the gate electrode 7 and diffusion regions 9, respectively.

The capacitance of the MOS capacitor of FIG. 1 is partially dependent upon the voltage applied between the gate contact 3 and the source contact 10. In particular, if a voltage of an appropriate polarity relative to the source contact 10 is applied to the gate contact 3, an electron channel will be formed in the substrate 2, beneath the second insulator 11 and between the two diffusion regions 9. As will be understood by those skilled in the art, the formation of an electron channel beneath the second insulator 11 will induce a corresponding charge on the gate electrode 7, thereby causing the gate electrode 7 and electron channel to act as spaced parallel plates of a capacitor. However, the capacitance of the device of FIG. 1 varies, at least initially, according to the magnitude of the voltage applied between the gate contact 3 and the source contact 10. This variation in capacitance as a function of voltage is best illustrated by FIG. 2. In particular, as the voltage between the gate contact 3 and source contact 10 varies between 0 V and an internal power supply voltage Vcc (i.e., the operating voltage range), the capacitance of the device slowly increases in proportion to the applied voltage bias. This variation of capacitance over the operating range of the capacitor is generally undesirable.

Referring now to FIG. 3, a second MOS capacitor according to the prior art is illustrated. The capacitor of FIG. 3 includes all of the structural features of the capacitor of FIG. 1, but it also includes a well region 20 of first conductivity type (for example, N-type) which extends beneath the entire device. In operation, the MOS capacitor of FIG. 3 differs from the MOS capacitor of FIG. 1 in that even before an initial voltage is applied, a region containing free electrons is provided opposite the gate electrode 7. Accordingly, the capacitance of the MOS capacitor of FIG. 3 does not vary in the operating voltage range. This aspect of the MOS capacitor of FIG. 3 is best shown by FIG. 4 which illustrates the capacitance characteristics as a function of applied voltage. In particular, when the applied voltage bias between the source contact 10 and gate contact 3 is varied from 0 V to the internal power voltage Vcc, the maximum capacitance is constantly maintained. Thus, the MOS capacitor of FIG. 3 has a larger effective capacity per unit area since the capacitance is not varied even though the applied voltage bias is varied. However, as described below, the capacitor of FIG. 3 may have reduced performance characteristics in other respects.

In order to form the gate contact 3 of the MOS capacitor of FIG. 3, a contact window is typically formed in the polycide gate electrode 7. The thin second insulator 11 is also formed under the polycide gate electrode 7. The thick insulator 5 is formed in the region of the contact window for forming the gate contact 3. As will be appreciated by one of ordinary skill in the art, application of a voltage across the gate contact and source contact 3 and 10, respectively, may cause parasitic breakdown at the junction between the edges of the thick insulator 5 and the thin second insulator 11. Accordingly, despite the advantageous constant capacitance characteristics of the capacitor of FIG. 3, it suffers from reduced breakdown voltage capability which may limit the capacitor's operational utility.

In view of the above limitations of conventional MOS capacitors, there continues to be a need for improved semiconductor capacitors.

OBJECT AND SUMMARY OF THE INVENTION

In view of the foregoing, it is one object of the present invention to provide a MOS capacitor with a fixed capacitance over its operating voltage range.

Another object of the present invention is to provide a capacitor with increased effective capacitance per unit area over the capacitor's operating voltage range.

It is another object of the invention to provide a MOS capacitor having reduced susceptibility to insulator breakdown.

In view of the above objects, the present invention provides capacitors having C-V capacitance characteristics which do not vary across the operating voltage range. The capacitors, therefore, have a larger effective storage capacity per unit area. The present invention also has reduced susceptibility to insulator breakdown. These advantages of the present invention are provided by forming a capacitor having a semiconductor substrate of a first conductivity type. A region of insulating material is formed on an upper surface of the substrate. A well region of a second conductivity type semiconductor material is also formed adjacent the region of insulating material, but is spaced therefrom so that the substrate extends to the surface therebetween. A source region of the second conductivity semiconductor material is formed in the well region. An insulating layer is formed on the source region and extends over the region of insulating material. A first electrode is formed on the insulating layer and a second electrode is formed on the source region.

By forming a capacitor according to the above described structure, a P-N junction is preferably established in the substrate between the source region and the region of insulating material beneath the insulating layer. This P-N junction provides a capacitor with a substantially constant capacitance when a voltage is applied between the first electrode and the second electrode. Furthermore, because some of the voltage differential is established across the P-N junction during operation, the electric field at the corner of the region of insulating material and the insulating layer is reduced. Thus, the likelihood of breakdown of the insulating layer at the corner of the region of insulating material is similarly reduced.

In a further embodiment of the present invention, a third electrode is formed on the first electrode. The third electrode is preferably circumscribed by the area formed by the region of insulating material.

In another embodiment of the present invention, the second conductivity type semiconductor material of the source region has a higher carrier concentration therein relative to the second conductivity type semiconductor material of the well region.

The present invention further includes embodiments where the first conductivity type semiconductor material comprises P-type conductivity semiconductor material and the second conductivity type semiconductor material comprises N-type conductivity semiconductor material. Likewise, in alternative embodiments, the first conductivity type comprises N-type conductivity semiconductor material and the second conductivity type semiconductor material comprises P-type conductivity semiconductor material.

In another embodiment of the present invention, the well region comprises an annular ring circumscribing the region of insulating material. The first source region then comprises an annular ring formed within the well region. In such an annular device, the annular ring may be substantially rectangular in shape or it may be substantially circular in shape.

In a further embodiment of the present invention, the capacitor further comprises a second well region formed in the substrate. The second well region is formed adjacent to and disposed from the region of insulating material opposite the first well region. A second source region is formed in the second well region. The insulating layer formed on the upper surface of the substrate and the upper surface of the first region of insulating material further extends onto the second source region and between the second source region and the region of insulating material. A fourth electrode is formed on the second source region and electrically connected to the second electrode.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION OF THE INVENTION

Figure 1:
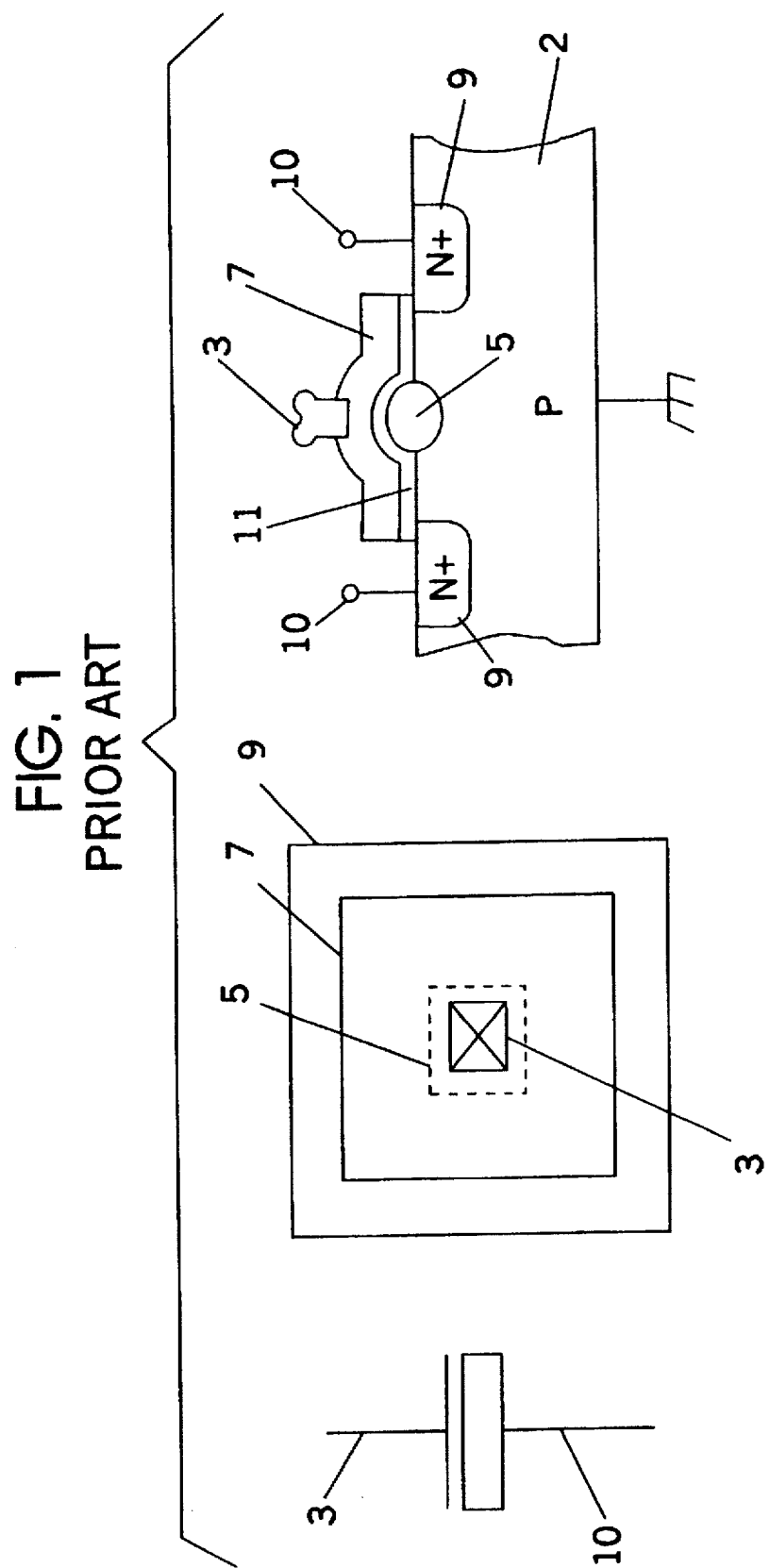
FIG. 1 is a view illustrating a structure of a first conventional MOS capacitor.
Figure 2:
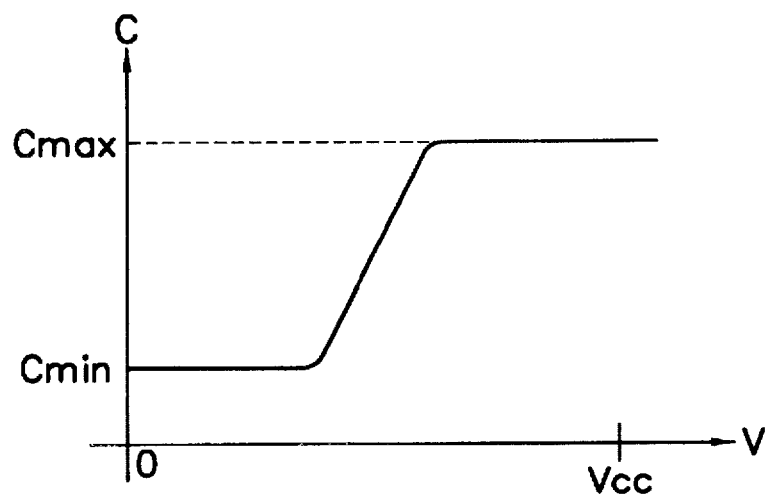
FIG. 2 is a view illustrating a characteristic C-V curve for the capacitor of FIG. 1.
Figure 4:
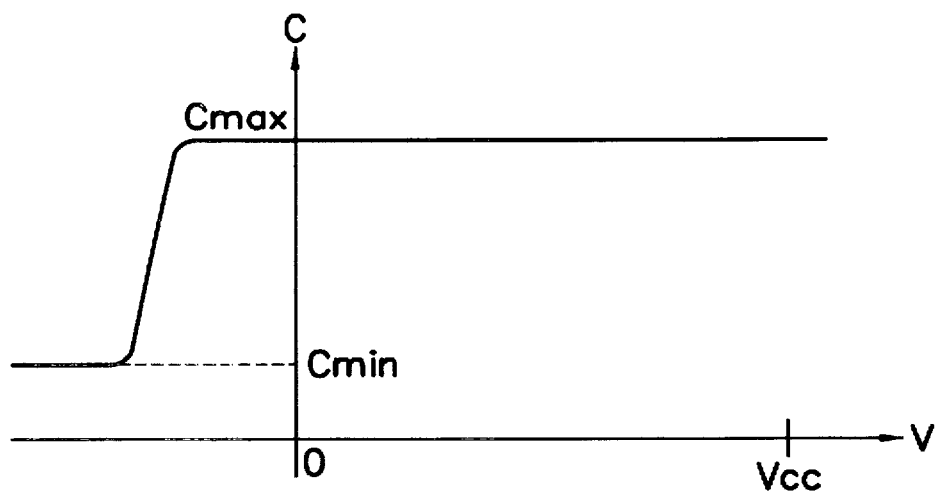
FIG. 4 is a view illustrating a characteristic C-V curve for the capacitor of FIG. 3.
Figure 3:
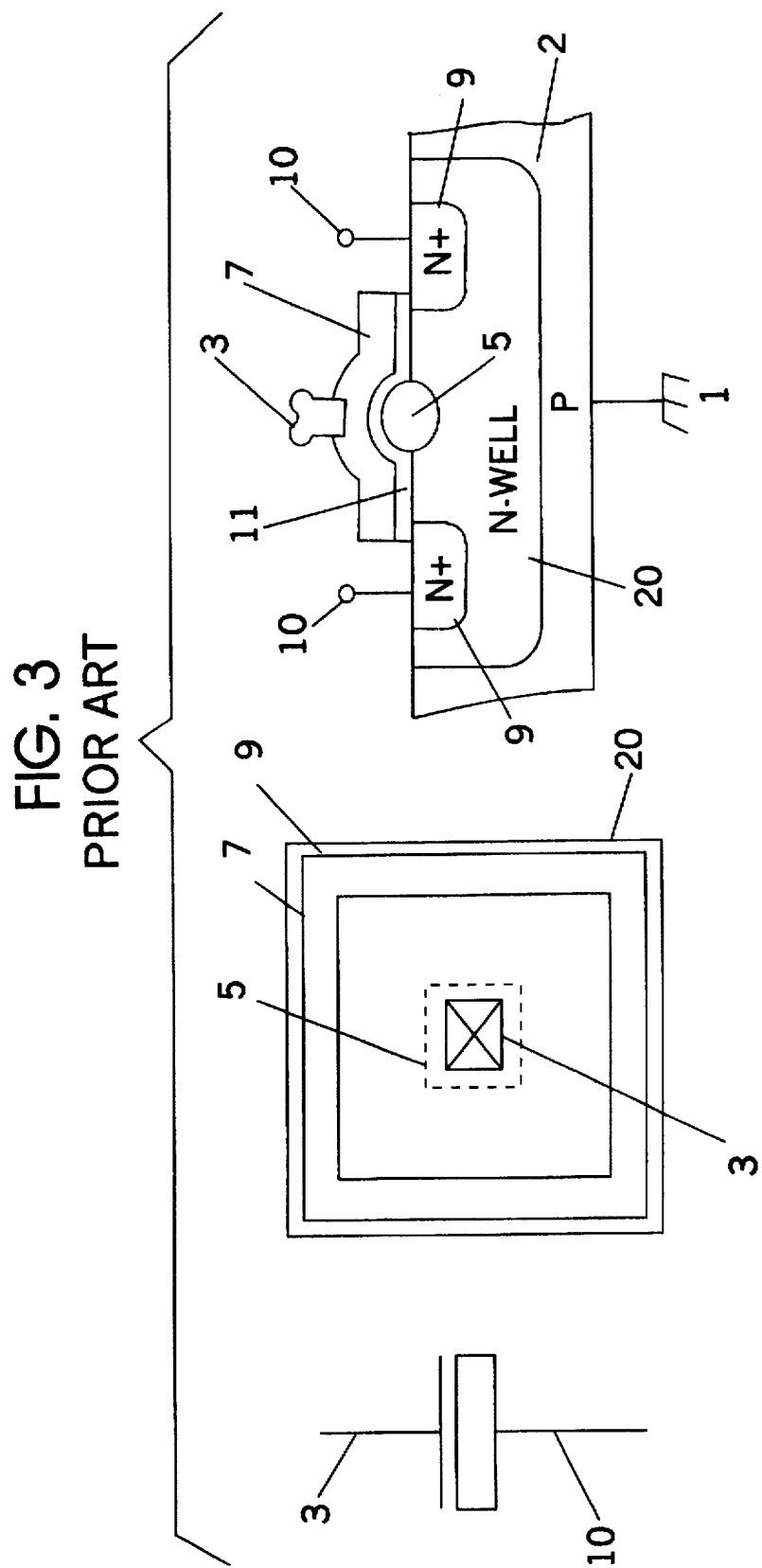
FIG. 3 is a view illustrating a structure of a second conventional MOS capacitor.
Figure 5A:
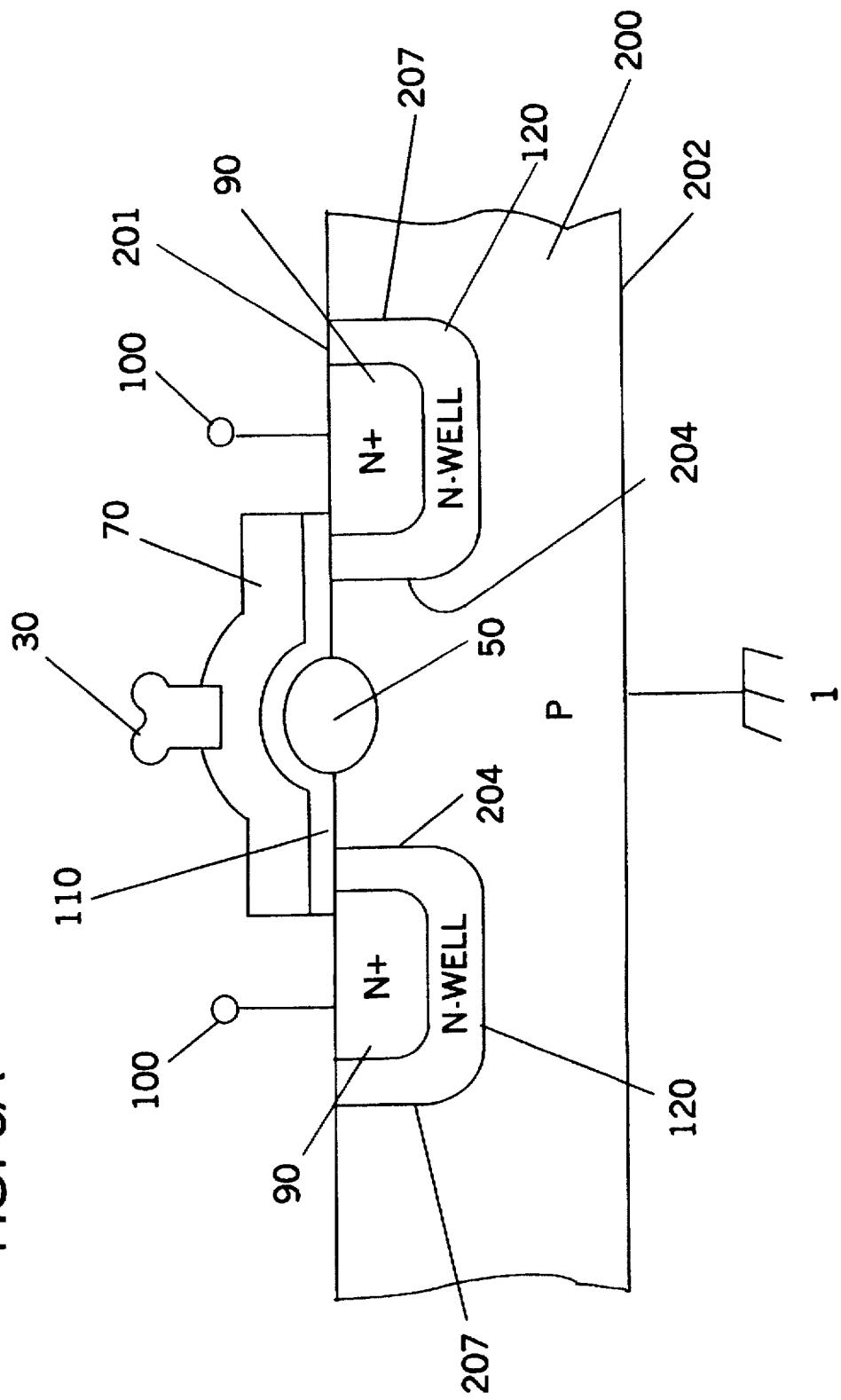
FIG. 5A is cross-sectional view illustrating a structure of a MOS capacitor according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements in FIGS. 5A–5C. Referring now to FIG. 5A, a substrate 200 of a first conductivity type semiconductor material has an upper surface 201 and a lower surface 202 opposite the upper surface 201. The lower surface 202 is preferably grounded by electrode 1. The substrate may be formed of P-type conductivity semiconductor material. A first region of insulating material 50 (e.g. field oxide) is formed on the upper surface of the substrate 200. A well region 120 of a second conductivity type semiconductor material is formed adjacent the first region of insulating material 50 but disposed from the first region of insulating material 50 so as to provide a region of the first conductivity type semiconductor material between the well region 120 and the first region of insulating material 50. The well region 120 extends to the upper surface of the substrate 200. Thus, the well region 120 is defined by an inner wall 204 and an outer wall 207. The well region 120 may be N-type semiconductor material when the substrate 200 is P-type semiconductor material.

Figure 5B:
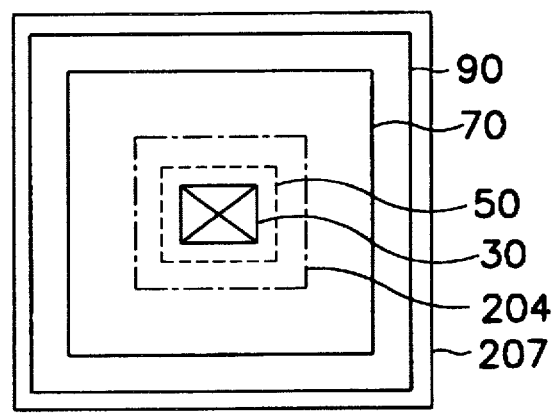
FIG. 5B is a top view of the capacitor of FIG. 5A.
Figure 5C:
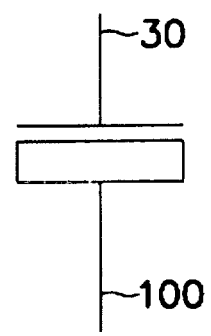
FIG. 5C is a schematic representation of the capacitor of FIG. 5A.

A source region 90 of the second conductivity type semiconductor material is formed in the well region 120 and extends to the upper surface of the substrate 200. The source region 90 is illustrated in FIG. 5A as $N^+$ type conductivity semiconductor material. Thus, the second conductivity type semiconductor material of the source region 90 has a higher carrier concentration than is present in the second conductivity type semiconductor material of the first well region 120. An insulating layer 110 is formed on the upper surface of the substrate 200 and the upper surface of the region of insulating material 50. The insulating layer 110 extends onto the source region 90 and is formed on the substrate 200 between the source regions 90 and covers the region of insulating material 50. The capacitor of FIG. 5A also has a first electrode 70 formed on the insulating layer 110 and a second electrode 100 formed on the source region 90. A third electrode 30 is also illustrated as formed on the first electrode 70. As seen in FIG. 5B, the third electrode 30 is circumscribed by the area formed by the region of insulating material 50.

As best illustrated by FIG. 5A, the formation of the insulating layer 110 is such that the inner wall 204 of the well region 120 falls below the insulating layer 110 between the source region 90 and the region of insulating material 50 to form a P-N junction in the substrate 200. This aspect of the present invention provides a capacitor with a substantially constant capacitance when a voltage is applied between a first electrode 30 and a second electrode 100 and with reduced likelihood of breakdown of the insulating layer 110.

As FIG. 5B illustrates, the capacitor of FIG. 5A may be formed as an annular device. In such a case, the well region 120 comprises an annular ring circumscribing the region of insulating material 50 and the source region 90 comprises an annular ring formed within well region 120. As will be appreciated by those of skill in the art, the shape of these annular rings may vary and would include the substantially rectangular shape of FIG. 5B as well as a substantially circular shape. Furthermore, as will be appreciated by those of skill in the art, the present capacitor may be formed as elongated bands or stripes. In such a case, only one side of the device of FIG. 5A need be fabricated, although any number of bands of electrically connected source and gate regions could be included.

In fabricating the devices of the present invention, the first conductivity type material may be P-type conductivity semiconductor a material in which case the second conductivity type semiconductor material comprises N-type conductivity semiconductor material. Likewise, if the first conductivity type semiconductor material is N-type conductivity semiconductor material, then the second conductivity type semiconductor material would be P-type conductivity semiconductor material.

Suitable materials for the formation of the insulating layer 110 and/or the region of insulating material 50 include silicon dioxide and silicon nitride. The first electrode 70 may be formed of polycide of a conductivity type opposite that of the substrate 200 and the remaining electrodes may be formed of aluminum. The well regions and source regions may be formed utilizing diffusion or other semiconductor fabrication techniques known to those of skill in the art. While the present invention has been described with respect to formation within a substrate, as will be appreciated by those of skill in the art, the substrate 200 may comprise an epitaxial layer or other formation of semiconductor material which may be formed on a substrate. Accordingly, the present invention should not be limited to formation of a capacitor in a substrate and the use of the term substrate herein should be construed as applying to any formation of semiconductor material suitable for creating the capacitor of the present invention.

While there have been illustrated and described what are considered to be preferred embodiments of the present invention, it will be understood by those skilled in the art that various changes and modifications may be made, and equivalents may be substituted for elements thereof without departing from the true scope of the present invention. In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor capacitor comprising:
    a semiconductor substrate of a first conductivity type, said semiconductor substrate having an upper surface and a lower surface disposed opposite said upper surface;
    a first region of insulating material formed on said upper surface of said substrate;
    a first well region of a second conductivity type semiconductor material formed adjacent said first region of insulating material and disposed from said first region of insulating material so as to provide a region of said first conductivity type semiconductor material between said first well region and said first region of insulating material, said first well region extending to the upper surface of said substrate;
    a first source region of said second conductivity semiconductor material formed in said well region and extending to the upper surface of said substrate, said first source region having a higher second conductivity type carrier concentration therein relative to the second conductivity type carrier concentration in said first well region;
    an insulating layer formed on the upper surface of said substrate and the upper surface of said first region of insulating material and extending between said first region of insulating material and onto said first source region;
    a first electrode formed on said insulating layer; and
    a second electrode formed on said first source region.

2. The capacitor of claim 1, further comprising a third electrode formed on said first electrode and wherein said third electrode is circumscribed by the area formed by said first region of insulating material.

3. The capacitor of claim 1, wherein said first conductivity type comprises P-type conductivity semiconductor material and wherein said second conductivity type semiconductor material comprises N-type conductivity semiconductor material.

4. The capacitor of claim 1 wherein said first well region comprises an annular ring circumscribing said region of insulating material and wherein said first source region comprises an annular ring formed within said first well region.

5. The capacitor of claim 4 wherein said annular ring is substantially rectangular in shape.

6. The capacitor of claim 4 wherein said annular ring is substantially circular in shape.

7. The capacitor of claim 1, further comprising:
    a second well region formed in said substrate, said second well region being formed adjacent to and disposed from said region of insulating material opposite said first well region so as to provide a region of said first conductivity type semiconductor material between said second well region and said first region of insulating material, said second well region extending to the upper surface of said substrate;
    a second source region formed in said second well region and extending to the upper surface of said substrate;
    wherein said insulating layer formed on the upper surface of said substrate and the upper surface of said first region of insulating material further extends onto said second source region between said second source region and over said first region of insulating material; and
    a fourth electrode formed on said second source region and electrically connected to said second electrode.

8. The capacitor of claim 1 wherein said first electrode is formed of polycide.

* * * * *